(12) United States Patent
Gu et al.

(10) Patent No.: US 9,898,991 B2
(45) Date of Patent: Feb. 20, 2018

(54) SHIFT REGISTER, GATE DRIVER AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei (CN)

(72) Inventors: Xiaofang Gu, Beijing (CN); Tong Yang, Beijing (CN); Rui Ma, Beijing (CN); Ming Hu, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 276 days.

(21) Appl. No.: 14/105,649

(22) Filed: Dec. 13, 2013

(65) Prior Publication Data

US 2014/0168049 A1 Jun. 19, 2014

(30) Foreign Application Priority Data

Dec. 14, 2012 (CN) .......................... 2012 1 0546392

(51) Int. Cl.
*G09G 3/36* (2006.01)
*G11C 19/28* (2006.01)

(52) U.S. Cl.
CPC ......... *G09G 3/3685* (2013.01); *G09G 3/3674* (2013.01); *G11C 19/28* (2013.01)

(58) Field of Classification Search
CPC .................... G09G 3/3685; G09G 3/3674
See application file for complete search history.

(56) References Cited

U.S. PATENT DOCUMENTS

2003/0231735 A1 12/2003 Moon et al.
2006/0044247 A1 3/2006 Jang et al.
(Continued)

FOREIGN PATENT DOCUMENTS

CN 1860519 A 11/2006
CN 1868003 A 11/2006
(Continued)

OTHER PUBLICATIONS

Second Chinese Office Action Appln. No. 201210546392.2; dated Jul. 3, 2015.
(Continued)

*Primary Examiner* — William Boddie
*Assistant Examiner* — Alecia D English
(74) *Attorney, Agent, or Firm* — Ladas & Parry LLP

(57) ABSTRACT

Provided are a shift register, a gate driver and a display device capable of eliminating voltage coupled noise at an output terminal. The shift register comprises a pulling-up unit, a clock control unit, a resetting unit, an inverting unit and a pulling-down unit; the pulling-up unit is connected with a shift trigging signal terminal, a high level signal terminal and the resetting unit; the clock control unit is connected with the pulling-up node, a clock signal terminal and the pulling-down unit; the resetting unit is connected with a reset signal terminal, a low level signal terminal, the pulling-up node and the output terminal; the inverting unit is connected with the high and low level signal terminals, the pulling-up node and the pulling-down unit; the pulling-down unit is connected with the pulling-up node, the pulling-down node, the low level signal terminal, the shift trigging signal terminal and the output terminal.

19 Claims, 5 Drawing Sheets

(56) References Cited

U.S. PATENT DOCUMENTS

2010/0166136 A1    7/2010  Tobita
2013/0077736 A1*   3/2013  Son ......................... G09G 3/20
                                                        377/69
2014/0050294 A1    2/2014  Cao et al.

FOREIGN PATENT DOCUMENTS

| CN | 102629459 A | 8/2012 |
| CN | 102708818 A | 10/2012 |
| EP | 2743915 A2  | 6/2014 |

OTHER PUBLICATIONS

First Chinese Office Action Appln. No. 201210546392.2; dated Feb. 4, 2015.
Extended European Search Report dated Mar. 17, 2014 Appln. No. EP 13 19 7107.
EPO Office Action dated Nov. 2, 2017; Appln. 13197107.9.

* cited by examiner

US 9,898,991 B2

SHIFT REGISTER, GATE DRIVER AND DISPLAY DEVICE

TECHNICAL FIELD

The present invention relates to a field of display technology, and particularly to a shift register, a gate driver and a display device.

BACKGROUND

Liquid crystal displays have been used widely in various fields of manufacturing and living, and display is implemented in a liquid crystal display by using driving circuits to drive respective pixels in a liquid crystal panel. Driving circuits of a liquid crystal display majorly comprise a gate driving circuit and a data driving circuit, wherein the data driving circuit is used to latch input image data in accordance with timings of a clock signal and convert the latched data into analog signals so as to input the same to data lines of the liquid crystal panel, and the gate driving circuit is used to convert the clock signal into a turn-on/turn-off voltage through a shift register (SR) and output the same to a corresponding gate line of the liquid crystal panel. Wherein only a current stage of shift register outputs the turn-on voltage at a same time, that is to say, only the voltage on the gate line corresponding to one row of pixels is the turn-on voltage, and voltages on the gate lines corresponding to remaining rows of pixels are all the turn-off voltage, so that the data signal at this moment is only input to the row of pixels through the data driving circuit. At a next moment, a next stage of shift register outputs a scanning signal so that the voltage on the gate line corresponding to a next row of pixels is the turn-on voltage, and the voltages on the gate lines corresponding to remaining rows of pixels are all the turn-off voltage. The rest may be deduced similarly, and a progressive scanning of the pixels in the liquid crystal panel may be achieved. The above turn-on voltage occurs on the respective rows sequentially and progressively and is also referred to as a scanning signal.

In the structure described above, the main method for converting the clock signal into the scanning signal by the shift register is to trigger an operation of a current stage of shift register in response to the output of the scanning signal from a previous stage of shift register, and then output the clock signal of the current stage of shift register as the scanning signal, and at the same time, the scanning signal at the current stage is fed back to the previous stage of shift register on one hand so as to reset the previous stage of shift register, and is input to the next stage of shift register as a shift trigging signal for the next stage of shift register on the other hand. Similarly, the respective stages of shift registers output the scanning signal sequentially.

However, as well-known by those skilled in the art, the clock signal is a square wave which is switched periodically between a first level and a second level, and there are many clock cycles in a scanning period during which the scanning signal cycles from a first row of pixels to a last row of pixels. With respect to a certain shift register, only a time period being half of the clock cycle is used to output the scanning signal, but the output terminal of the shift register may generally output a fluctuated level under an effect of the clock signal in remaining clock cycles during which no scanning signal should be output, such that a great circuit noise occurs on the corresponding gate line and the thin film transistors in the pixel units may be turned on improperly, and in turn the circuit functions abnormally.

SUMMARY

A major object of embodiments of the present disclosure is to provide a shift register, a gate driver and a display device, which may eliminate voltage coupled noise generated by a clock signal at an output terminal of the shift register effectively and enable the shift register to operate more stably.

In view of this, the embodiments of the present disclosure adopt solutions as follows.

In an aspect of the embodiments of the present disclosure, there is provided a shift register comprising: a pulling-up unit, a clock control unit, a resetting unit, an inverting unit and a pulling-down unit; the pulling-up unit is connected with a shift trigging signal terminal, a high level signal terminal and the resetting unit, respectively, wherein a node at which the pulling-up unit is connected with the resetting unit is a pulling-up node, the pulling-up unit is used for pulling up a voltage at the pulling-up node according to a shift trigging signal from the shift trigging signal terminal; the clock control unit is connected with the pulling-up node, a clock signal terminal and the pulling-down unit, respectively, wherein a node at which the clock control unit is connected with the pulling-down unit is an output terminal, the clock control unit is used for controlling whether to transmit a clock signal from the clock signal terminal to the output terminal according to the voltage at the pulling-up node; the resetting unit is connected with a reset signal terminal, a low level signal terminal, the pulling-up node and the output terminal, respectively, and is used for pulling down the voltage at the pulling-up node and the voltage at the output terminal according to a reset signal from the reset signal terminal; the inverting unit is connected with the high level signal terminal, the low level signal terminal, the pulling-up node and the pulling-down unit, respectively, wherein a node at which the inverting unit is connected with the pulling-down unit is a pulling-down node, the inverting unit is used for making level of the voltage at the pulling-up node and level of the voltage at the pulling-down node be inverted to each other; the pulling-down unit is connected with the pulling-up node, the pulling-down node, the low level signal terminal, the shift trigging signal terminal and the output terminal, respectively, and is used for pulling down the voltages at the pulling-up node and the output terminal according to the voltage at the pulling-down node and pulling down the voltage at the output terminal according to the shift trigging signal from the shift trigging signal terminal.

During operation of the shift register, the clock signal is transferred to the output terminal of the shift register when the output terminal of the shift register is required to output a gate driving signal; and the clock signal is insulated from the output terminal of the shift register and the output terminal is discharged when the output terminal of the shift register is not required to output the gate driving signal.

In another aspect of the embodiments of the present disclosure, there is provided a gate driver comprising a plurality of stages of shift registers provided in the embodiments of the present disclosure, which are connected with each other in cascade.

In a still aspect of the embodiments of the present disclosure, there is provided a display device comprising the gate driver provided in the embodiments of the present disclosure.

With the shift register, the gate driver and the display device provided in the embodiments of the present disclosure, the clock signal may be transferred to the output terminal of the shift register when the output terminal is required to output the gate driving signal, while the clock signal is insulated from the output terminal of the shift register and the output terminal is discharged when the output terminal is not required to output the gate driving signal. Thus, the output terminal of the shift register is always in a discharging state and always remains a low level as long as it is not its turn to output the gate driving signal, so that the voltage coupled noise generated by the clock signal at the output terminal of the shift register may be eliminated effectively and the shift register may operate more stably, which may increase a lifespan of the shift register effectively.

BRIEF DESCRIPTION OF THE DRAWINGS

In order to illustrate the technical solutions in embodiments of the present disclosure or in the prior art more clearly, a brief introduction will be given to the accompanying drawings used for describing the embodiments of the present disclosure or the prior art. Obviously, the accompanying drawings described as below are only for illustrating some of the embodiments of the present disclosure, and those skilled in the art can obtain other accompanying drawings from the drawings described without paying any inventive labor.

DETAILED DESCRIPTION

Hereinafter, the technical solutions in the embodiments of the present disclosure will be described clearly and thoroughly with reference to the accompanying drawings of the embodiments of the present disclosure. Obviously, the embodiments as described are only some of the embodiments of the present disclosure, and are not all of the embodiments of the present disclosure.

Figure 1:
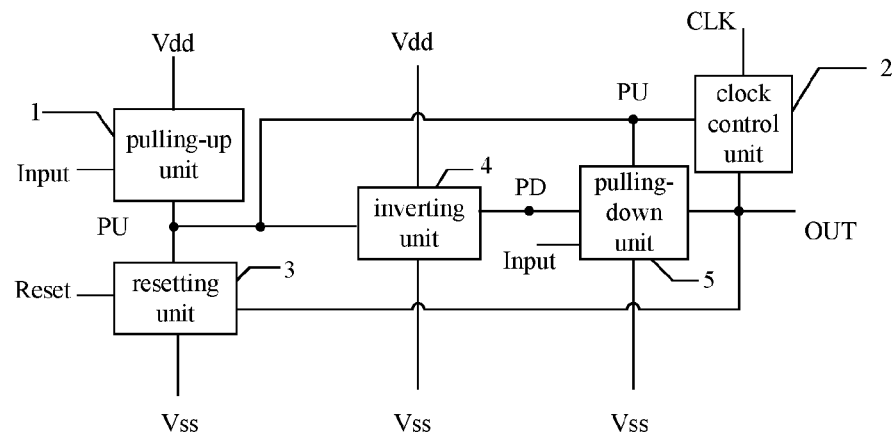
FIG. 1 is a schematic diagram illustrating a circuit of a shift register according to embodiments of the present disclosure.

As shown in FIG. 1, according to an embodiment of the present disclosure, there is provided a shift register comprising: a pulling-up unit 1, a clock control unit 2, a resetting unit 3, an inverting unit 4 and a pulling-down unit 5.

The pulling-up unit 1 is connected with a shift trigging signal terminal Input, a high level signal terminal Vdd and the resetting unit 3, respectively, wherein a node at which the pulling-up unit 1 is connected with the resetting unit 3 is a pulling-up node PU, the pulling-up unit 1 is used for pulling up a voltage at the pulling-up node PU according to a shift trigging signal from the shift trigging signal terminal Input.

The clock control unit 2 is connected with the pulling-up node PU, a clock signal terminal CLK and the pulling-down unit 5, respectively, wherein a node at which the clock control unit 2 is connected with the pulling-down unit 5 is an output terminal OUT, the clock control unit 2 is used for controlling whether to transmit a clock signal from the clock signal terminal CLK to the output terminal OUT according to the voltage at the pulling-up node PU.

The resetting unit 3 is connected with a reset signal terminal Reset, a low level signal terminal Vss, the pulling-up node PU and the output terminal OUT, respectively, and may be used for pulling down the voltage at the pulling-up node PU and the voltage at the output terminal OUT according to a reset signal from the reset signal terminal Reset.

The inverting unit 4 is connected with the high level signal terminal Vdd, the low level signal terminal Vss, the pulling-up node PU and the pulling-down unit 5, respectively, wherein a node at which the inverting unit 4 is connected with the pulling-down unit 5 is a pulling-down node PD, the inverting unit 4 may be used for making level of the voltage at the pulling-up node PU and level of the voltage at the pulling-down node PD being inverted to each other.

The pulling-down unit 5 is connected with the pulling-up node PU, the pulling-down node PD, the low level signal terminal Vss, the shift trigging signal terminal Input and the output terminal OUT, respectively, and is used for pulling down the voltages at the pulling-up node PU and the output terminal OUT according to the voltage at the pulling-down node PD and pulling down the voltage at the output terminal OUT according to the shift trigging signal from the shift trigging signal terminal Input.

With the shift register provided in the embodiments of the present disclosure, the clock signal from the clock signal terminal CLK may be transferred to the output terminal OUT of the shift register by the clock control unit 2 when the output terminal OUT is required to output a gate driving signal, while the clock signal from the clock signal terminal CLK may be insulated from the output terminal OUT by the clock control unit 2 and the output terminal OUT is discharged through the resetting unit 3 or the pulling-down unit 5 when the output terminal OUT is not required to output the gate driving signal. Thus, the output terminal OUT of the shift register is always in a discharging state and always remains a low level as long as it is not its turn to output the gate driving signal, so that the voltage coupled noise generated by the clock signal CLK may be eliminated effectively and the shift register may operate more stably, which may increase a lifespan of the shift register effectively.

In particular, the above pulling-up unit 1, the clock control unit 2, the resetting unit 3, the inverting unit 4 and the pulling-down unit 5 may be implemented in various circuit structures.

Figure 2:
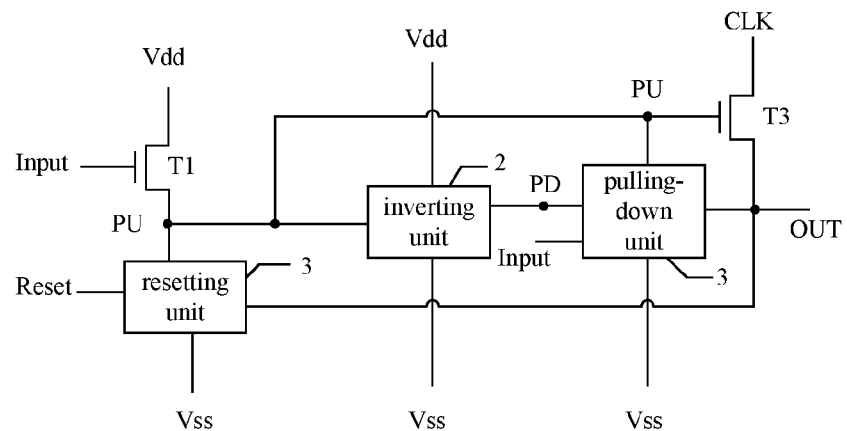
FIG. 2 is a schematic diagram illustrating another circuit of a shift register according to the embodiments of the present disclosure.

In an example, as illustrated in FIG. 2, in an embodiment of the present disclosure, the pulling-up unit 1 may be a first thin film transistor T1 having a gate connected with the shift trigging signal terminal Input, a drain connected with the high level signal terminal Vdd, and a source connected with the pulling-up node PU.

The clock control unit 2 may be a third thin film transistor 13 having a gate connected with the pulling-up node PU, a source connected with the clock signal terminal CLK, and a drain connected with the output terminal OUT. Particularly, the third thin film transistor T3 is used for transferring the clock signal to the output terminal OUT when a voltage at the pulling-up node PU is at a first level, and insulating the clock signal CLK from the output terminal OUT when the voltage at the pulling-up node PU is at a second level. In an example, the first level is different from the second level, for example, the first level and the second level are inverted to each other, that is, if the first level may be a high level, the second level may be a low level, and vice versa. For a purpose of convenience, the first level refers to the high level and the second level refers to the low level hereinafter, unless the context clearly indicates otherwise.

Of course, the pulling-up unit 1 and the clock control unit 2 may utilize other circuit structures in other embodiments of the present disclosure, as long as they can realize their respective functions, and the present disclosure is not limited thereto.

The resetting unit 3 is used for pulling-down the voltage at the pulling-up node PU and the voltage at the output terminal OUT according to the reset signal from the reset signal terminal Reset. In a detailed example, the resetting unit 3 may pull down the voltage at the pulling-up node PU and the voltage at the output terminal OUT when the reset signal from the reset signal terminal Reset is at the first level, and insulate the pulling-up node PU and the output terminal OUT from the low level signal terminal Vss when the reset signal from the reset signal terminal Reset is at the second level.

Figure 3:
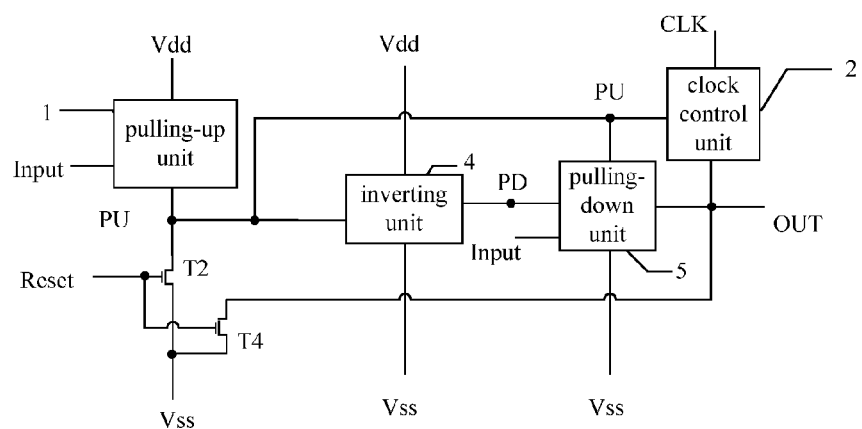
FIG. 3 is a schematic diagram illustrating a further circuit of a shift register according to the embodiments of the present disclosure.

As illustrated in FIG. 3, in an embodiment of the present disclosure, the resetting unit 3 may comprise a second thin film transistor T2 and a fourth thin film transistor T4, wherein a gate of the second thin film transistor T2 is connected with the reset signal terminal Reset, a drain thereof is connected with the pulling-up node PU, and a source thereof is connected with the low level signal terminal Vss; a gate of the fourth thin film transistor T4 is connected with the reset signal terminal Reset, a drain thereof is connected with the output terminal OUT, and a source thereof is connected with the low level signal terminal Vss.

When the reset signal from the reset signal terminal Reset is active, for example, when the Reset is at the first level, voltages at the gates of the second thin film transistor T2 and the fourth thin film transistor T4 are both at the first level, so that these two thin film transistors are turned on, and in turn a low level signal from the low level signal terminal Vss is transferred to the output terminal OUT through the fourth thin film transistor T4 and to the pulling-up node PU through the second thin film transistor T2. Thus, the output terminal OUT may be discharged to the low level signal terminal Vss such that the voltage noise at the output terminal OUT may be reduced effectively. Further, the third thin film transistor T3 may be turned off since the pulling-up node PU is at the second level, then the clock signal terminal CLK is disconnected from the output terminal OUT, so that the voltage coupled noise generated by the clock signal from the clock signal terminal CLK at the output terminal OUT may be eliminated effectively and the shift register may operate more stably.

Additionally, because the pulling-up node PU is at the second level, the pulling-down node PD is pulled up to the first level under the effect of the inverting unit 4, thus the pulling-down unit 5 may further pull down the voltage at the output terminal OUT and the voltage at the pulling-up node PU under the effect of the first level at the pulling-down node PD, so the output signal of the shift register may be stabilized further.

When the reset signal is inactive, for example, when the Reset is at the second level, the voltages at the gates of the second thin film transistor T2 and the fourth thin film transistor T4 are both at the second level, therefore these two thin film transistors are turned off, and in turn the pulling-up node PU and the output terminal OUT are disconnected from the low level signal terminal Vss, respectively.

Figure 4:
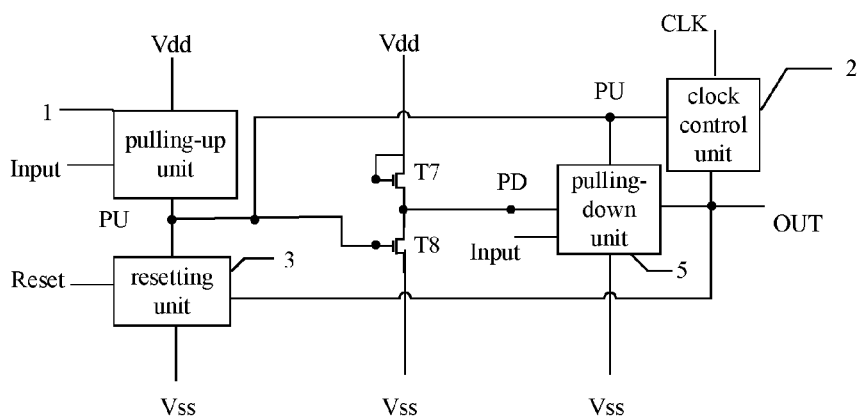
FIG. 4 is a schematic diagram illustrating a still further circuit of a shift register according to the embodiments of the present disclosure.

In particular, the inverting unit 4 may have various circuit structures. For example, as illustrated in FIG. 4, in an embodiment of the present disclosure, the inverting unit 4 may comprise a seventh thin film transistor T7 and a eighth thin film transistor T8, wherein a gate and a drain of the seventh thin film transistor T7 are connected with the high level signal terminal Vdd together, and a source thereof is connected with the pulling-down node PD; a gate of the eighth thin film transistor T8 is connected with the pulling-up node PU, a drain thereof is connected with the pulling-down node PD, and a source thereof is connected with the low level signal terminal Vss.

When the pulling-up node PU is at the first level, the eighth thin film transistor T8 is turned on, its ON-resistance decreases correspondingly, therefore a voltage drop across the eighth thin film transistor T8 is reduced when a voltage dividing is performed by the eighth thin film transistor T8 and the seventh thin film transistor T7, such that the voltage at the pulling-down node PD drops. Further, the dropping of the voltage at the pulling-down node PD would cause the pulling-down unit 5 to insulate the pulling-up node PU from the low level signal terminal Vss, therefore the pulling-up node PU is ensured not to be discharged, which may remain its voltage being at the first level.

On the contrary, when the pulling-up node PU is at the second level, the eighth thin film transistor T8 is not turned on and its resistance is large, therefore the voltage drop across the eighth thin film transistor T8 is increased when the voltage dividing is performed by the eighth thin film transistor T8 and the seventh thin film transistor T7, such that the voltage at the pulling-down node PD rises. Further, the rising of the voltage at the pulling-down node PD would cause the pulling-down unit 5 to pull down the voltages at the pulling-up node PU and the output terminal OUT.

Of course, the inverting unit 4 may be also implemented in other circuit structures, for example, a inverter, in other embodiments of the present disclosure, as long as the level of the voltage at the pulling-up node and the level of the voltage at the pulling-down node are inverted to each other, and the present disclosure is not limited thereto.

The pulling-down unit 5 may be used for pulling down the voltage at the pulling-up node PU and the voltage at the output terminal OUT according to the voltage at the pulling-down node PD, and pulling down the voltage at the output terminal OUT according to the shift trigging signal from the shift triggering signal terminal Input. In particular, the pulling-down unit 5 may pull down the voltage at the output terminal OUT and the voltage at the pulling-up node PU when the voltage at the pulling-down node PD is at the first level, and insulate the pulling-up node PU and the output terminal OUT from the low level signal terminal Vss when the voltage at the pulling-down node PD is at the second level; and also may pull down the voltage at the output terminal OUT when the shift trigging signal terminal Input is at the first level, and insulate the output terminal OUT from the low level signal terminal Vss when the shift trigging signal terminal Input is at the second level.

Figure 5:
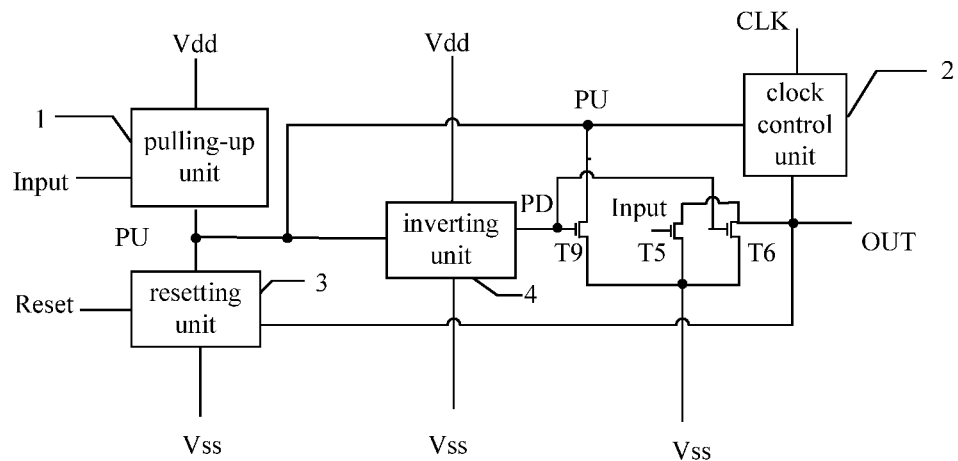
FIG. 5 is a schematic diagram illustrating a still further circuit of a shift register according to the embodiments of the present disclosure.

For example, as illustrated in FIG. 5, in an embodiment of the present disclosure, the pulling-down unit 5 may comprise a fifth thin film transistor T5, a sixth thin film transistor T6 and a ninth thin film transistor T9, wherein a gate of the fifth thin film transistor T5 is connected with the shift trigging signal terminal Input, a drain thereof is connected with the output terminal OUT, and a source thereof is connected with the low level signal terminal Vss. The fifth thin film transistor T5 is turned on so as to pull down the voltage at the output terminal OUT when the shift trigging signal from the shift trigging signal terminal Input is at the first level, and is turned off so as to insulate the output terminal OUT from the low level signal terminal Vss when the shift trigging signal from the shift trigging signal Input is at the second level. A gate of the sixth thin film transistor T6 is connected with the pulling-down node PD, a drain thereof is connected with the output terminal OUT, and a source thereof is connected with the low level signal terminal Vss. The sixth thin film transistor T6 is turned on so as to pull down the voltage at the output terminal OUT when the voltage at the pulling-down node PD is at the first level, and is turned off so as to insulate the output terminal OUT from the low level signal terminal Vss when the voltage at the pulling-down node PD is at the second level. A gate of the ninth thin film transistor T9 is connected with the pulling-down node PD, a drain thereof is connected with the pulling-up node PU, and a source thereof is connected with the low level signal terminal Vss. The ninth thin film transistor T9 is turned on so as to pull down the voltage at the pulling-up node PU when the voltage at the pulling-down node PD is at the first level, and is turned off so as to insulate the output terminal OUT from the low level signal terminal Vss when the voltage at the pulling-down node PD is at the second level.

It should be noted that the thin film transistors mentioned in the previous embodiments are manufactured by a standard process, therefore the source and the drain have a same structure and may be interchanged with each other. That is to say, the source of the thin film transistor may be replaced with the drain, and the drain of the thin film transistor may be replaced with the source in the embodiments of the present disclosure.

Figure 6:
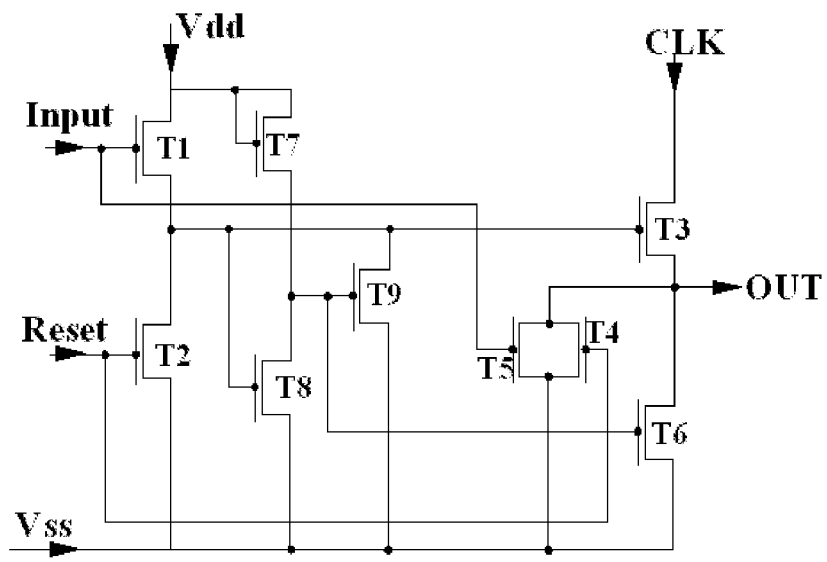
FIG. 6 is a detailed circuit diagram illustrating the shift register according to the embodiments of the present disclosure.

As illustrated in FIG. 6, a circuit principle diagram of a detailed example for the shift register according to the embodiments of the present disclosure may be obtained by substituting the detailed circuits of the respective units in FIG. 2-FIG. 5 into the circuit in FIG. 1. Implementations for internal circuits of the respective units may utilize other manners, as long as the function of the unit can be realized, and the present disclosure is not limited thereto.

Figure 7:
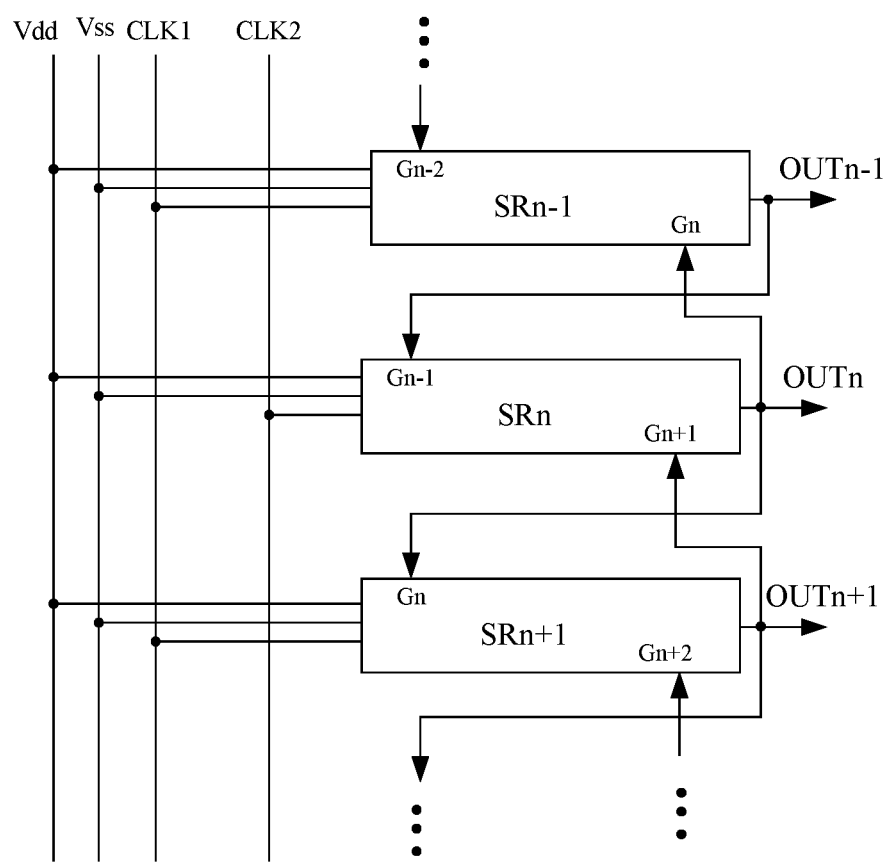
FIG. 7 is a schematic diagram illustrating a circuit in which a plurality of shift registers according to the embodiments of the present disclosure are connected with each other in cascade.
Figure 8:
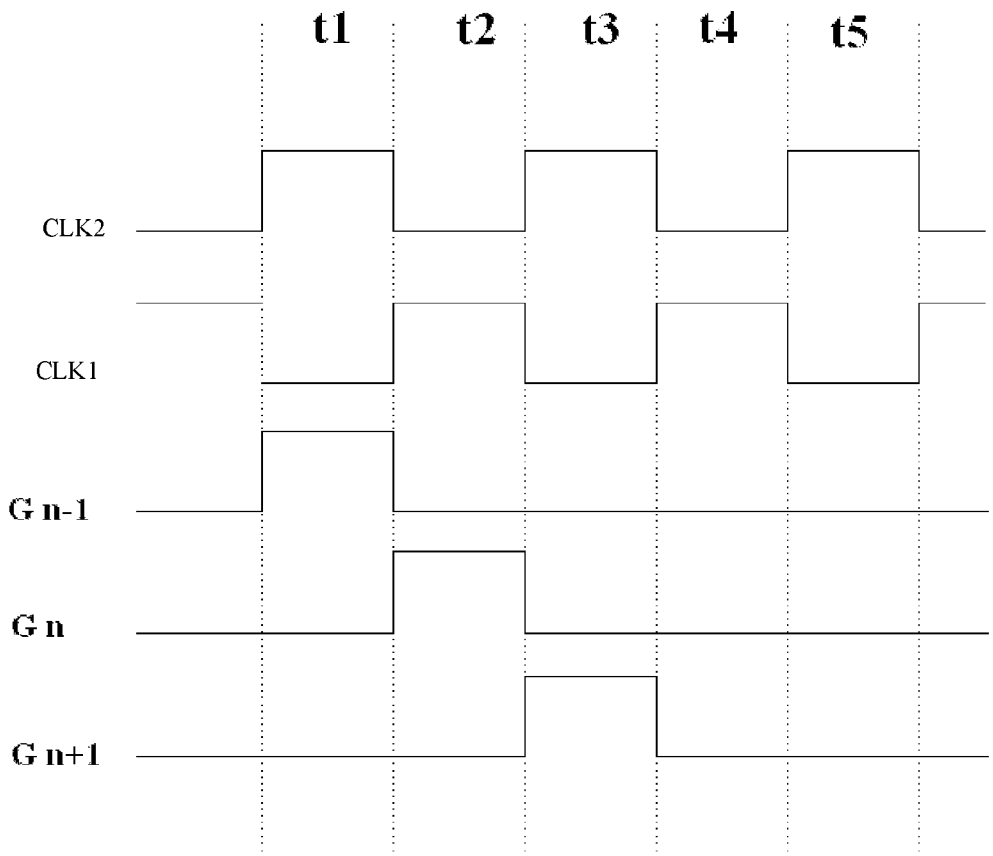
FIG. 8 is a timing sequence diagram showing signals in one shift register in FIG. 7.

It should be noted that, in a driving circuit of a display device, a plurality of stages of shift registers are connected with each other in cascade and operate so as to drive pixels in respective rows in the display device. As illustrated in FIG. 7, an output signal from an output terminal OUTn−1 of a previous stage of shift register SRn−1 is input as a shift trigging signal at the shift trigging signal terminal of a current stage of shift register SRn, the output signal from the output terminal OUTn of the current stage of shift register SRn is used as the shift trigging signal at the shift trigging signal terminal of a next stage of shift register SRn+1 and the reset signal of the previous stage of shift register SRn-1 at the same time. When each stage of shift register operates normally, its respective input signals, such as the shift trigging signal at the shift trigging signal terminal Input, the reset signal at the reset signal terminal Reset and the clock signal at the clock signal terminal CLK, follow a certain timing regularity. FIG. 8 illustrates a timing relationship among the above input signals. Thereafter an operation process of each stage of shift register according to the embodiments of the present disclosure will be explained in details in connection with the FIGS. 1-8.

It should also be noted that, in order to enable two adjacent shift registers to output gate driving signals sequentially and continuously under effect of the clock signal, a next stage of shift register is needed to be still driven by the high level of the clock signal after a current stage of shift register is driven by the high level of the clock signal, which is difficult to be implemented when the clock signal is switched between the high level and the low level periodically. Therefore, two clock signals with a phase difference of 180° may be provided to the adjacent shift registers, respectively.

In FIG. 8, Gn denotes an output from the output terminal OUTn of the current stage of shift register. Gn−1 denotes an output from the output terminal OUTn−1 of the previous stage of shift register and is also used as the shift trigging signal Input of the current stage of shift register, and Gn+1 denotes an output from the output terminal OUTn+1 of the next stage of shift register and is also used as the reset signal at the reset signal terminal Reset of the current stage of shift register. Below, the operation process of the current stage of shift register will be described in detail.

As illustrated in FIG. 8, during a t1 phase, the shift trigging signal from the shift trigging signal terminal Input is at the high level, which represents that the output terminal OUTn−1 of the previous stage of shift register outputs the high level, that is, Gn−1 is at the high level. According to the progressive scanning characteristic of the gate scanning signal, only one stage of shift register may output the high level at a same time, therefore remaining stages of shift registers are impossible to output the high level, except the previous stage of shift register outputs the high level. Considering a fact that the reset signal from the reset signal terminal Reset is also the output signal from the next stage of shift register, the reset signal terminal Reset is unlikely to be at the high level. Since the signal from the output terminal of each stage of shift register is formed by the corresponding clock signal, outputting of the high level from the output terminal of the previous stage of shift register may also represent that the clock signal from the clock signal terminal CLK1 for driving the previous stage of shift register should be at the high level during the t1 phase, while the clock signal from the clock signal terminal CLK2 for driving the current stage of shift register should be at the low level during the t1 phase.

During the t1 phase, for the current stage of shift register, the shift trigging signal from the shift trigging signal terminal Input is at the high level, the reset signal from the reset signal terminal Reset is at the low level, and the clock signal from the clock signal terminal CLK2 for driving the current stage of shift register is at the low level. Actions of respective parts of the circuit are as follows. The shift trigging signal from the shift trigging signal terminal Input is at the high level, so that the first thin film transistor T1 and the fifth thin film transistor T5 in the pulling-down unit 5 are turned on, particularly the first thin film transistor T1 is turned on so that the high level of Vdd is input to the pulling-up node PU, and in turn to ensure the pulling-up node PU remaining at the high level during the t1 phase. At the same time, the high level of the pulling-up node PU may turn on the eighth thin film transistor T8 in the inverting unit 4, and a potential at the pulling-down node PD may be at a low potential at this moment by designing sizes of the seventh thin film transistor T7 and the eighth thin film transistor T8, such that the ninth thin film transistor T9 and the sixth thin film transistor T6 are turned off, that is, the output terminal OUT and the pulling-up node PU of the current stage of shift register are insulated from the low level signal terminal Vss, respectively. At the same time, the fifth thin film transistor T5 is turned on, then the output terminal OUT is discharged so as to remain at the low level of the low level signal terminal Vss, so that the voltage coupled noise generated by the clock signal from the clock signal terminal CLK2 may be eliminated effectively and the shift register may operate more stably.

During a t2 phase, the current stage of shift register should output the gate driving signal during the t2 phase after the previous stage of shift register outputs the gate driving signal during the t1 phase. Accordingly, during this phase, for the current stage of shift register, the shift trigging signal from the shift trigging signal terminal Input is at the low level, the reset signal from the reset signal terminal Reset is at the low level, the clock signal from the clock signal terminal CLK2 for driving the current stage of shift register is at the high level, the output terminal OUTn of the current stage of shift register is at the high level, that is, Gn is at the high level.

On one hand, the low level of the shift trigging signal from the shift trigging signal terminal Input turns off T1 and T5, and the pulling-up node PU goes on to remain at the high level at this time because T9 in the pulling-down unit 5 is still turned off, the pulling-down node PD goes on to remain at the low level so that T9 and T6 remain to be turned off, thus the output terminal OUT of the current stage of shift register is insulated from the low level signal terminal Vss. Turning off of T5 enables the output terminal OUT of the current stage of shift register to be insulated from the low level signal terminal Vss. Now, all paths between the output terminal OUT of the current stage of shift register and the low level signal terminal Vss are disconnected, then it is prepared to output the gate driving signal at the output terminal OUT of the current stage of shift register.

On the other hand, the clock signal from the clock signal terminal CLK2 is at the high level, the potential at the pulling-up node PU is higher during this phase than the potential at the pulling-up node PU during the t1 phase by a bootstrapping effect of a parasitic capacitance between the gate and source of T3, so that T3 is turned on, the clock signal from the clock signal terminal CLK2 is transferred to the output terminal OUT as the gate driving signal output from the current stage of shift register.

Optionally, in order to strengthen the bootstrapping effect, the shift register further comprises a bootstrapping capacitor in an embodiment of the present disclosure, wherein one terminal of the bootstrapping capacitor is connected with the pulling-up node, and the other terminal is connected with the clock signal terminal.

During a t3 phase, after the current stage of shift register outputs the gate driving signal during the t2 phase, the next stage of shift register outputs the gate driving signal, which is also feedback to the current stage of shift register as the reset signal at the reset signal terminal Reset of the current stage of shift register during the t3 phase. Accordingly, during this phase, for the current stage of shift register, Input is at the low level, Reset is at the high level, the clock signal from the clock signal terminal CLK1 for driving the next stage of shift register is at the high level, and the output terminal OUTn+1 of the next stage of shift register is at the high level, that is, Gn+1 is at the high level.

Therefore, for the current stage of shift register, the shift trigging signal from the shift trigging signal terminal Input is at the low level, the reset signal from the reset signal terminal Reset is at the high level, the clock signal from the clock signal terminal CLK2 is at the low level, and the output terminal OUT also becomes the low level. In particular, the high level of the terminal Reset turns on T2 and T4 in the resetting unit 3 so as to discharge the pulling-up node PU and the output terminal OUT, therefore both of the pulling-up node PU and the output terminal OUT drop to the low level. Because the potential at the PU node drops to the low level, T8 in the inverting unit 4 is turned off, the resistance of T8 is increased, a voltage-dividing result between T7 and T8 is that the pulling-down node PD becomes the high level, so that T9 and T6 in the pulling-down unit 5 are turned on, and the pulling-up node PU and the output terminal OUT are further discharged and remain at the low level.

During a t4 phase, it is neither the current stage of shift register nor the previous or next stage of shift register with respect to the current stage of shift register that outputs the gate driving signal. Therefore, during this phase, for the current stage of shift register, Input is at the low level, Reset is at the low level. At the same time, the clock signal from the clock signal terminal CLK2 for driving the current stage of shift register is at the high level.

At this time, T3 is turned off because the pulling-up node PU becomes the low level during the t3 phase, and thus the high level signal at the terminal CLK2 would not be transmitted to the output terminal OUT; T6 and T9 in the pulling-down unit 5 still remain to be turned on because the pulling-down node PD remains the high level as during the t3 phase, so that the voltage coupled noise generated by the clock signal from the clock signal terminal CLK2 may be eliminated effectively and both of the pulling-up node PU and the output terminal OUT may remain the low level signal as during the t3 phase.

During a t5 phase, it is neither the current stage of shift register nor the previous or next stage of shift register with respect to the current stage of shift register that outputs the gate driving signal. Therefore, during this phase, for the current stage of shift register, Input is at the low level, Reset is at the low level. At the same time, the clock signal from the clock signal terminal CLK2 driving the current stage of shift register is at the high level.

During this phase, remaining signals are same as those during the t4 phase, except the clock signal from the clock signal terminal CLK2 is at the low level, which is different from the case during the t4 phase. T3 is turned off because the pulling-up node PU is at the low level, the low level signal at the CLK2 terminal would not be transmitted to the output terminal OUT. T6 and T9 in the pulling-down unit 5 still remain to be turned on because the pulling-down node PD remains the high level, so that the voltage coupled noise generated by the clock signal from the clock signal terminal CLK2 may be eliminated effectively and both of the pulling-up node PU and the output terminal OUT may remain the low level signal as during the t3 phase, and thus the gate driving signal is output stably.

During following clock cycles, the operation states of the current stage of shift register are similar to the operation states during the t4 and t5 phases, particularly the operation state during the t4 phase and the operation state during the t5 phase occur alternately, until a shift trigging signal in a next scanning cycle brings the current stage of shift register to the t1 phase back.

Figure 9:
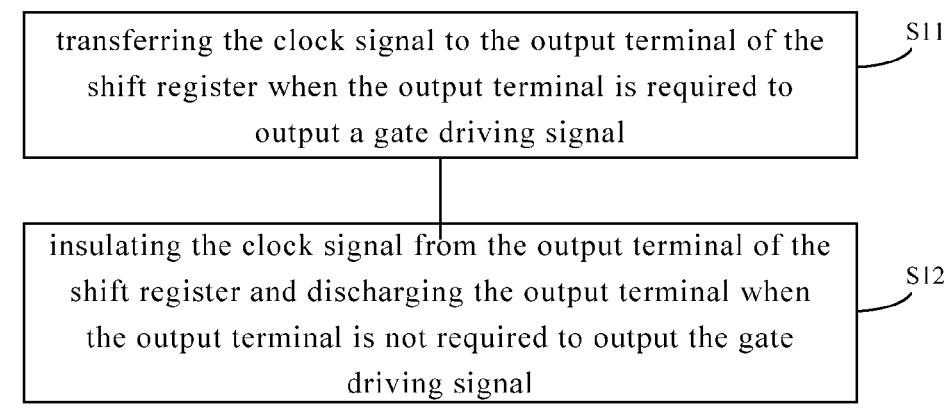
FIG. 9 is a flowchart illustrating an operation method for the shift register according to the embodiments of the present disclosure.

Accordingly, in the embodiments of the present disclosure, there is further provided a method for operating the above shift register, as illustrated in FIG. 9, the method comprises the following steps:

S11, transferring the clock signal to the output terminal of the shift register when the output terminal is required to output the gate driving signal;

S12, insulating the clock signal from the output terminal of the shift register and discharging the output terminal when the output terminal is not required to output the gate driving signal.

With the method for operating the shift register provided in the embodiments of the present disclosure, the clock signal may be transferred to the output terminal of the shift register when the output terminal is required to output the gate driving signal, while the clock signal is insulated from the output terminal and the output terminal is discharged when the output terminal is not required to output the gate driving signal. Thus, the output terminal of the shift register is always in a discharging state and always remains a low level as long as it is not its turn to output the gate driving signal, so that the voltage coupled noise generated by the clock signal at the output terminal of the shift register may be eliminated effectively and the shift register may operate more stably, which may increase a lifespan of the shift register effectively.

In particular, in the step S11, after the output terminal of the previous stage of shift register outputs the gate driving signal and before the output terminal of the next stage of shift register outputs the gate driving signal, the output terminal of the current stage of shift register may be insulated from the low level signal terminal by the pulling-down unit and the resetting unit, and the clock signal may be transferred to the output terminal of the current stage of shift register by the clock control unit.

In particular, when the clock control unit transfers the clock signal to the output terminal of the shift register, the voltage at the pulling-up node may be raised on a basis of the original high potential at the pulling-up node through a jump transition of the clock signal, so that the clock control unit may transfer the clock signal to the output terminal of the shift register.

In the embodiments of the present disclosure, the output terminal of the current stage of shift register is required to output the gate driving signal only in S11, while the output terminal of the current stage of shift register is not required to output the gate driving signal in the step S12. The clock signal may be insulated from the output terminal of the current stage of shift register and the output terminal of the current stage of shift register may be discharged in various manners in the step S12, according to whether the gate driving signal is output from the output terminal of the current stage of shift register, the output terminal of the previous stage of shift register and the output terminal of the next stage of shift register.

In an example, when the output terminal of the previous stage of shift register outputs the gate driving signal, the clock signal is insulated from the output terminal of the current stage of shift register by the clock control unit, and the output terminal of the current stage of shift register is discharged through the pulling-down unit.

In an example, when the output terminal of the next stage of shift register outputs the gate driving signal, the clock signal is insulated from the output terminal of the current stage of shift register by the clock control unit, and the output terminal and the pulling-up node of the current stage of shift register are discharged through the resetting unit.

In an example, after the output terminal of the next stage of shift register outputs the gate driving signal, the clock signal is insulated from the output terminal of the current stage of shift register by the clock control unit, and the pulling-up node and the output terminal of the current stage of shift register are discharged through the pulling-down unit.

As a result, the shift register according to the embodiments of the present disclosure may remain its output terminal to be in the discharging state and always at the low level when the output terminal is not required to output the gate driving signal in the different timings, so that the voltage coupled noise generated by the clock signal at the output terminal of the shift register may be eliminated effectively and the shift register may operate more stably.

The operation method for the shift register has been explained in detail in the description for the shift register previously, so details are omitted herein.

In the embodiments of the present disclosure, there is further provided a gate driver correspondingly, comprising a plurality of stages of shift registers provided in the embodiments of the present disclosure, which are connected with each other in cascade. Therefore, the gate driver may also realize the benefit effects of the shift register In the embodiments of the present disclosure, there is further a display device correspondingly, comprising any one of the gate driver provided in the embodiments of the present disclosure.

The above descriptions only illustrate the specific embodiments of the present invention, and the protection scope of the present invention is not limited to this. Given the teaching as disclosed herein, variations or substitutions, which can easily occur to any skilled pertaining to the art, should be covered by the protection scope of the present invention. Thus, the protection scope of the present invention is defined by the claims.

What is claimed is:

1. A shift register comprising: a pulling-up unit, a clock control unit, a resetting unit, an inverting unit and a pulling-down unit;

the pulling-up unit is connected with a shift trigging signal terminal, a high level signal terminal and the resetting unit, respectively, wherein a node at which the pulling-up unit is connected with the resetting unit is a pulling-up node, the pulling-up unit is used for pulling up a voltage at the pulling-up node according to a shift trigging signal from the shift trigging signal terminal;

the clock control unit is connected with the pulling-up node, a clock signal terminal and the pulling-down unit, respectively, wherein a node at which the clock control unit is connected with the pulling-down unit is an output terminal, the clock control unit is used for controlling whether to transmit a clock signal from the clock signal terminal to the output terminal according to the voltage at the pulling-up node;

the resetting unit is connected with a reset signal terminal, a low level signal terminal, the pulling-up node and directly with the output terminal, respectively, and is used for pulling down the voltage at the pulling-up node and the voltage at the output terminal according to a reset signal from the reset signal terminal;

the inverting unit is connected with the high level signal terminal, the low level signal terminal, the pulling-up node and the pulling-down unit, respectively, wherein a node at which the inverting unit is connected with the pulling-down unit is a pulling-down node, the inverting unit is used for ensuring level of the voltage at the pulling-up node and level of the voltage at the pulling-down node to be inverted each other;

the pulling-down unit is connected with the pulling-up node, the pulling-down node, the low level signal terminal, the shift trigging signal terminal and the output terminal, respectively, and is used for pulling down the voltages at the pulling-up node and the output terminal according to the voltage at the pulling-down node and pulling down the voltage at the output terminal according to the shift trigging signal from the shift trigging signal terminal, wherein the pulling-down unit comprises a fifth thin film transistor, a sixth thin film transistor and a ninth thin film transistor, wherein a gate of the fifth thin film transistor is connected with the shift trigging signal terminal, a drain thereof is connected with the output terminal and directly with a drain of the sixth thin film transistor, and a source thereof is connected with the low level signal terminal; a gate of the sixth thin film transistor is connected with the pulling-down node, a drain thereof is connected with the output terminal, and a source thereof is connected with the low level signal terminal; a gate of the ninth thin film transistor is connected with the pulling-down node, a drain thereof is connected with the pulling-up node which is a node different from the shift trigging signal terminal, and a source thereof is connected with the low level signal terminal, and wherein, when at least three stages of the shift registers are connected with each other in cascade, the output terminal of a previous stage of shift register is connected with the shift trigging signal terminal of a current stage of shift register, and the output terminal of the current stage of shift register is connected with the shift trigging signal terminal of a next stage of shift register and the reset signal terminal of the previous stage of shift register at the same time, and the reset signal terminal of the current stage of shift register is connected with the output terminal of the next stage of shift register.

2. The shift register of claim 1, wherein,
the pulling-up unit comprises a first thin film transistor, a gate thereof is connected with the shift trigging signal terminal, a drain thereof is connected with the high level signal terminal, and a source is connected with the pulling-up node;
the clock control unit comprises a third thin film transistor, a gate thereof is connected with the pulling-up node, a source thereof is connected with the clock signal terminal, and a drain thereof is connected with the output terminal.

3. The shift register of claim 1, wherein the resetting unit comprises a second thin film transistor and a fourth thin film transistor, wherein a gate of the second thin film transistor is connected with the reset signal terminal, a drain thereof is connected with the pulling-up node, and a source thereof is connected with the low level signal terminal; a gate of the fourth thin film transistor is connected with the reset signal terminal, a drain thereof is connected with the output terminal, and a source thereof is connected with the low level signal terminal.

4. The shift register of claim 1, wherein the inverting unit comprises a seventh thin film transistor and a eighth thin film transistor, wherein a gate and a drain of the seventh thin film transistor are connected with the high level signal terminal together, and a source thereof is connected with the pulling-down node; a gate of the eighth thin film transistor is connected with the pulling-up node, a drain thereof is connected with the pulling-down node, and a source thereof is connected with the low level signal terminal.

5. The shift register of claim 1, further comprising a bootstrapping capacitor, wherein one terminal of the bootstrapping capacitor is connected with the pulling-up node, and the other terminal is connected with the clock signal terminal.

6. The shift register of claim 1, wherein,
the clock control unit transfers the clock signal to the output terminal of the shift register when the output terminal is required to output a gate driving signal;
the clock control unit insulates the clock signal from the output terminal of the shift register, and the output terminal is discharged when the output terminal is not required to output the gate driving signal.

7. The shift register of claim 6, wherein,
the pulling-down unit and the resetting unit insulate the output terminal of the shift register from the low level signal terminal, and the clock control unit transfers the clock signal to the output terminal of the shift register, when the output terminal of the shift register is required to output the gate driving signal.

8. The shift register of claim 6, wherein the clock control unit transfers the clock signal to the output terminal of the shift register comprises:
the voltage at the pulling-up node is raised by a jump transition of the clock signal, so that the clock control unit transfers the clock signal to the output terminal of the shift register.

9. The shift register of claim 6, wherein,
the clock control unit insulates the clock signal from the output terminal of the shift register, and the pulling-down unit discharges the output terminal of the shift register, when the shift triggering signal from the shift trigging signal terminal is active;
the clock control unit insulates the clock signal from the output terminal of the shift register, and the resetting unit discharges the output terminal and the pulling-up node of the shift register, when the reset signal from the reset signal terminal is active; and
the clock control unit insulates the clock signal from the output terminal of the shift register, and the pulling-down unit discharges the pulling-up node and the output terminal of the shift register, when both of the shift triggering signal from the shift trigging signal terminal and the reset signal from the reset signal terminal are inactive.

10. A gate driver comprising a plurality of stages of shift registers of claim 1 connected in cascade.

11. The gate driver of claim 10, wherein for a current stage of shift register,
the clock control unit of the current stage of shift register transfers the clock signal to the output terminal of the current stage of shift register when the output terminal of the current stage of shift register is required to output a gate driving signal;
the clock control unit of the current stage of shift register insulates the clock signal from the output terminal of the current stage of shift register, and the output terminal of the current stage of shift register is discharged when the output terminal of the current stage of shift register is not required to output the gate driving signal.

12. The gate driver of claim 11, wherein,
the pulling-down unit and the resetting unit of the current stage of shift register insulate the output terminal of the current stage of shift register from the low level signal terminal, and the clock control unit of the current stage of shift register transfers the clock signal to the output terminal of the current stage of shift register, after the output terminal of a previous stage of shift register outputs the gate driving signal and before the output terminal of a next stage of shift register outputs the gate driving signal.

13. The gate driver of claim 12, wherein,
the voltage at the pulling-up node is raised by a jump transition of the clock signal, so that the clock control unit transfers the clock signal to the output terminal of the current stage of shift register.

14. The gate driver of claim 11, wherein,
the clock control unit insulates the clock signal from the output terminal of the current stage of shift register, and the pulling-down unit discharges the output terminal of the current stage of shift register, when the output terminal of the previous stage of shift register outputs the gate driving signal;
the clock control unit insulates the clock signal from the output terminal of the current stage of shift register, and the resetting unit discharges the output terminal and the pulling-up node of the current stage of shift register, when the output terminal of the next stage of shift register outputs the gate driving signal; and
the clock control unit insulates the clock signal from the output terminal of the current stage of shift register, and the pulling-down unit discharges the pulling-up node and the output terminal of the current stage of shift register, after the output terminal of the next stage of shift register outputs the gate driving signal.

15. A display device comprising the gate driver of claim 10.

16. The display device of claim 15, wherein, for a current stage of shift register,
the clock control unit of the current stage of shift register transfers the clock signal to the output terminal of the current stage of shift register when the output terminal of the current stage of shift register is required to output a gate driving signal;
the clock control unit of the current stage of shift register insulates the clock signal from the output terminal of the current stage of shift register, and the output terminal of the current stage of shift register is discharged when the output terminal of the current stage of shift register is not required to output the gate driving signal.

17. The display device of claim 16, wherein,
the pulling-down unit and the resetting unit of the current stage of shift register insulate the output terminal of the current stage of shift register from the low level signal terminal, and the clock control unit of the current stage of shift register transfers the clock signal to the output terminal of the current stage of shift register, after the output terminal of the previous stage of shift register outputs the gate driving signal and before the output terminal of the next stage of shift register outputs the gate driving signal.

18. The display device of claim 17, wherein,
the voltage at the pulling-up node is raised by a jump transition of the clock signal, so that the clock control unit transfers the clock signal to the output terminal of the current stage of shift register.

19. The display device of claim 16, wherein,
the clock control unit insulates the clock signal from the output terminal of the current stage of shift register, and the pulling-down unit discharges the output terminal of the current stage of shift register, when the output terminal of the previous stage of shift register outputs the gate driving signal;
the clock control unit insulates the clock signal from the output terminal of the current stage of shift register, and the resetting unit discharges the output terminal and the pulling-up node of the current stage of shift register, when the output terminal of the next stage of shift register outputs the gate driving signal; and
the clock control unit insulates the clock signal from the output terminal of the current stage of shift register, and the pulling-down unit discharges the pulling-up node and the output terminal of the current stage of shift register, after the output terminal of the next stage of shift register outputs the gate driving signal.

* * * * *